United States Patent [19]

Hayakawa et al.

[11] Patent Number: 5,502,008
[45] Date of Patent: Mar. 26, 1996

[54] METHOD FOR FORMING METAL PLUG AND/OR WIRING METAL LAYER

[75] Inventors: Hideaki Hayakawa; Tetsuo Gocho, both of Kanagawa; Junichi Sato, Tokyo, all of Japan

[73] Assignee: Sony Corporation, Tokyo, Japan

[21] Appl. No.: 347,192

[22] Filed: Nov. 21, 1994

Related U.S. Application Data

[63] Continuation of Ser. No. 120,636, Sep. 13, 1993, abandoned, which is a continuation of Ser. No. 889,851, May 28, 1992, abandoned.

[30]     Foreign Application Priority Data

May 29, 1991   [JP]   Japan ................................. 3-153958

[51] Int. Cl.$^6$ ................................................. H01L 21/465
[52] U.S. Cl. .................... 437/225; 437/228; 437/195; 437/192; 156/636.1; 148/DIG. 20
[58] Field of Search ...................... 437/192, 195, 437/228, 225, 193; 148/DIG. 19–20; 216/88–90, 38

[56]              References Cited

U.S. PATENT DOCUMENTS

| | | | |
|---|---|---|---|
| 4,560,436 | 12/1985 | Bukhman et al. | 156/643 |
| 4,562,100 | 12/1985 | Fryd et al. | 427/385.5 |
| 4,789,648 | 12/1988 | Chow et al. | 437/228 |
| 4,810,669 | 3/1989 | Kobayashi | 437/67 |
| 4,986,878 | 1/1991 | Malazgirt | 156/643 |
| 4,992,135 | 2/1991 | Doan | 156/636 |
| 5,026,666 | 6/1991 | Hills et al. | 437/41 |
| 5,084,419 | 1/1992 | Sakao | 437/228 |
| 5,110,766 | 5/1992 | Maeda et al. | 437/228 |
| 5,234,860 | 8/1993 | Gluck | 437/231 |
| 5,244,841 | 9/1993 | Marks et al. | 437/228 |
| 5,356,835 | 10/1994 | Somekh et al. | 437/192 |

FOREIGN PATENT DOCUMENTS 0223920   3/1987   European Pat. Off. .

*Primary Examiner*—Mary Wilczewski
*Assistant Examiner*—H. Jey Tsai
*Attorney, Agent, or Firm*—Hill, Steadman & Simpson

[57]              ABSTRACT

A method of forming a metal plug, including a step of flattening by polishing the surface of a contact plug which is formed by etching back a metal layer, for example, a deposited layer of Blk-W on a substrate. It also makes it possible to print a wiring metal layer by a lithographic process which has thus far been considered difficult to apply to Blk-W. In the method of the invention, a contact hole 3 is opened in an insulation film layer 2 on a substrate 1, and, after coating an adhesion layer 4, a metal layer 5 is deposited on the entire surface. Thereafter, the surface of the metal layer 5 is flattened by a polishing operation, and etched back to form a metal plug 7.

2 Claims, 4 Drawing Sheets

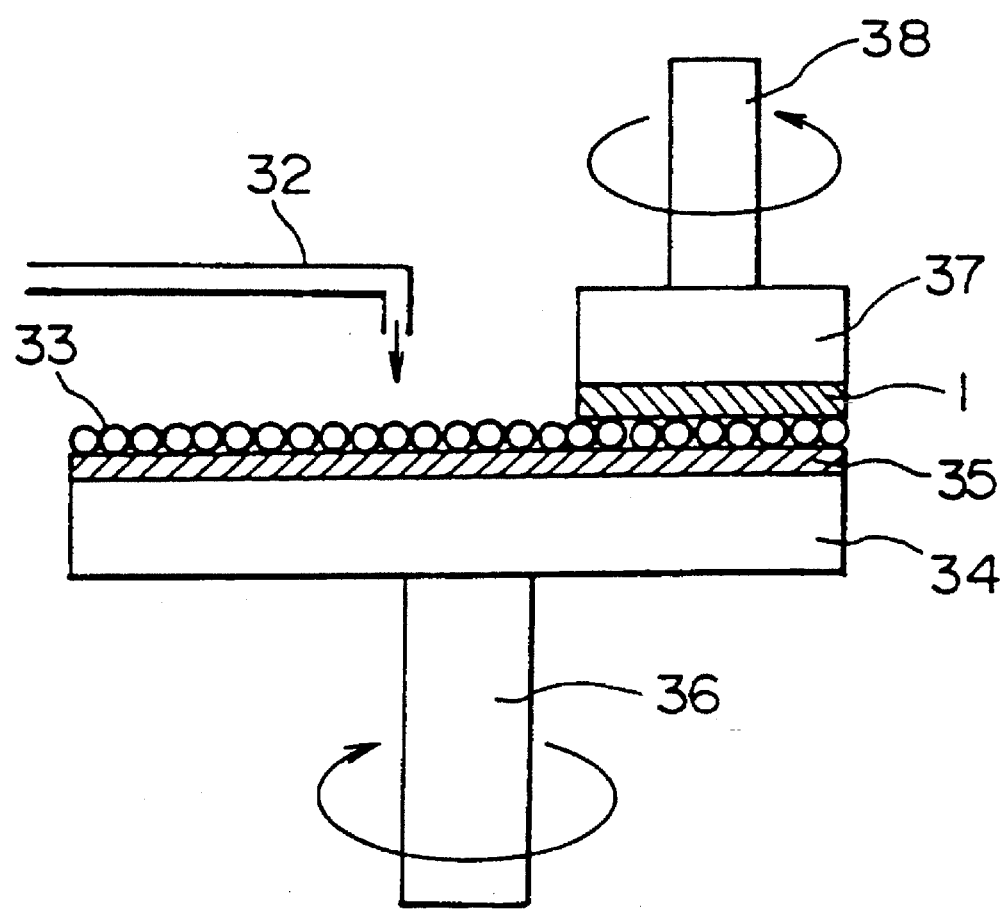

METHOD FOR FORMING METAL PLUG AND/OR WIRING METAL LAYER

This is a continuation of application Ser. No. 08/120,636 filed Sep. 13, 1993, abandoned which is a continuation of Ser. No. 07/889,851 filed on May 28, 1992, abandoned.

BACKGROUND OF THE INVENTION

1. Field of the Art

This invention relates to a method for forming a metal plug by filling a metal in a contact hole formed on a substrate. This invention also concerns a method of filling a metal in a contact hole in an insulation film on a substrate of a semiconductor device or the like, and forming a wiring layer on the insulation film layer by the use of that metal.

2. Description of the Prior Art

Along with the recent development of very large scale integration devices, there have been increasing demands for fine machining technics. For example, the contact holes to be formed in insulation film layers on semiconductor substrates are required to have a high aspect ratio through reductions in size.

In this connection, as wiring material for semiconductors, aluminum or aluminum alloys have been widely used in the art. However, aluminum or the like is insufficient in coverage in case of minute contact holes with a high aspect ratio. Therefore, it has become difficult to employ aluminum as wiring material for very large scale integration devices as before.

For this reason, the general practice has been to employ tungsten, which is satisfactory in coverage, especially in the property of covering stepped surface portions, filling tungsten in a contact hole by a CVD process to serve as a metal plug. In some cases an aluminum wiring layer is formed thereon, and in some cases tungsten itself is used as a wiring material.

FIG. 4 illustrates a conventional method of forming a metal plug of tungsten in a contact hole, which is formed in an insulation layer on a substrate. In this case, firstly a contact hole 3 is formed in an insulation layer 2 of $SiO_2$ on a substrate 1 in the form of a silicon wafer by an ordinary method (shown at (A) of FIG. 4).

Nextly, a TiN layer 4 is formed on the entire surface of the insulation layer 2 on the substrate 1 by a spattering process for the purpose of enhancing the adhesion of the metal plug to the substrate 1. ((B) of FIG. 4)

In the next place, as shown at (C) of FIG. 4, a tungsten layer 5 (hereafter referred to as "Blk-W layer" (blanket tungsten layer) for brevity) is deposited by an ordinary CVD process in such a manner as to fill the contact hole 3 and at the same time to cover the entire surface of the TiN layer 4.

The entire surface of the thus formed Blk-W layer 5 is etched back to provide a metalplug 7. ((D) of FIG. 4)

However, the Blk-W layer formed by an ordinary CVD process is quite different from the conventional aluminum wiring because in an ordinary CVD process the growth of tungsten takes place in columnar polycrystalline state. Therefore, despite the uniformity in orientation of the crystals, it has greater surface irregularities (FIG. 4 (C)), and gives rise to a crack seam 6 in a center portion off the contact hole, which becomes a void in some cases. Thus, the Blk-W layer is defective in surface morphology. Even after a metal plug is formed by etching back the entire surface of the Blk-W layer, it presents a surface contour which reflects the surface irregularities of the original Blk-W layer as shown at (D) of FIG. 4, coupled with a problem that the plug is etched in a large V-shape at the seam 6 which undergoes the etching to a greater degree than other surface portions. Accordingly, an aluminum wiring layer formed on such an irregular surface is undoubtedly susceptible to disconnections and thus extremely low in reliability.

Further, even in a case where the Blk-W layer is patterned for wiring purposes, the surface irregularities are likely to be reflected by irregularities in thickness of the resist film or by low patterning accuracy attributable to irregular reflections of exposure light rays, making application of a lithographic process extremely difficult.

SUMMARY OF THE INVENTION

The present invention contemplates to solve the above-discussed problems of the prior art, and has as its object the provision of a method for forming a metal plug, more specifically, a method of flattening the surface contour of a metal plug which is formed by etching back a metal layer, for instance, a Blk-W layer on a substrate.

It is another object of the present invention to provide a facilitated method for lithographically forming a wiring layer of Blk-W which has been difficult to apply by a lithographic process.

In accordance with the present invention, there is provided, for achieving the above-stated objectives, a method of forming a metal plug in a contact hole in an insulation film layer on a substrate, characterized in that the method comprises a step of polishing the surface of a metal layer deposited to fill the contact hole and cover the insulation film layer.

According to another aspect of the present invention, there is provided a method of depositing a metal to fill a contact hole in an insulation film layer on a substrate and forming a wiring layer by the use of that metal, characterized in that the method comprises a step of polishing the surface of the metal filling the contact hole and covering the insulation film layer.

The method of forming a metal plug and wiring according to the invention has a feature in the polishing step for flattening the surface of a metal layer after depositing the metal in such a manner as to fill a contact hole in an insulation film layer on a substrate and to cover the surface of the insulation film layer. Accordingly, known processes or methods can be employed for other steps, for example, for the step of providing an insulation film layer on a substrate, the step of forming a contact hole, the step of providing a metal layer, and the step of patterning a metal layer.

The substrate, the insulation film and the metal to be used in the present invention can be suitably selected from those which are generally adopted in the manufacturing processes of very large scale integration devices. Especially with regard to the metal, there can be suitably employed tungsten or other metals which have excellent properties in coverage for a contact hole of high aspect ratio and a high melting point, along with stability in the environments in which the very large scale integration device is expected to be used.

Further, according to the present invention, the polishing step may be carried out after flattening a metal layer by coating thereon a film of SOG or the like if necessary.

In forming a metal plug or a wiring layer according to the method of the invention, the surface of a metal layer can be suitably flattened by inclusion of the step of polishing the surface of the metal layer after forming the metal layer in such a manner as to fill a contact hole in an insulation film layer on a substrate and to cover the surface of the insulation film layer. Besides, it becomes possible to make the surface of the metal layer smoother all the more when a coating film is formed on the metal layer prior to polishing.

The above and other objects, features and advantages of the invention will become apparent from the following description and the appended claims, taken in conjunction with the accompanying drawings which show by way of example preferred embodiments of the invention.

BRIEF DESCRIPTION OF THE DRAWINGS

In the accompanying drawings:

FIG. 3 is a schematic view of a polisher employed in the present invention;

DESCRIPTION OF PREFERRED EMBODIMENTS

Figure 1A:
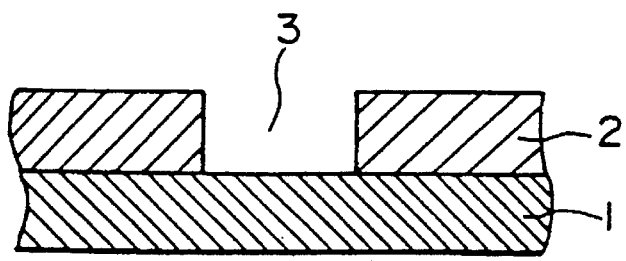
FIGS. 1A–1E are diagrammatic illustrations explanatory of a method of forming a metal plug according to the present invention.

Hereafter, the invention is described more particularly by way of its preferred embodiments with reference to the accompanying drawings. However, it is to be understood that the invention is not restricted to the particular embodiments shown. Throughout various figures, similar reference numerals or characters are used to designate similar component parts.

Figure 1B:
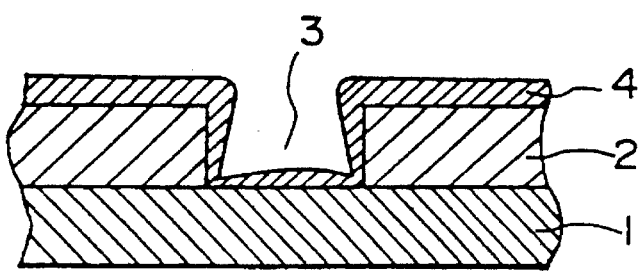
Figure 1C:
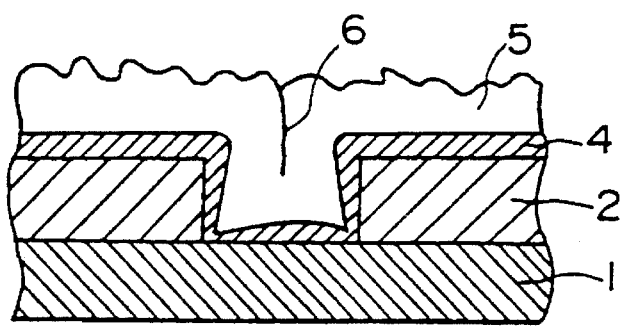
Figure 1D:
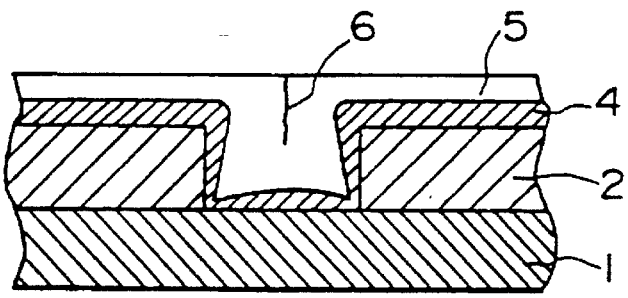
Figure 1E:
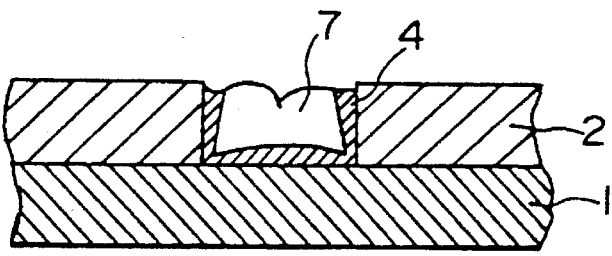

Referring first to FIG. 1, there is diagrammatically shown a method of forming a metal plug embodying the present invention.

More specifically, in this embodiment, a contact hole 3 of 0.4 μm in diameter is opened in a layer insulation film 2 of $SiO_2$ (film thickness=8,000 Å) which is provided on a substrate 1 in the form of a silicon wafer 1 by an ordinary method. ((A) of FIG. 1)

Nextly, for ensuring secure bondage to the substrate 1 of the metal which is to be formed into a metal plug, a TiN layer 4 is deposited on the entire surfaces in a thickness of 1,000 Å. ((B) of FIG. 1)

Succeedingly, a Blk-W layer 5 is deposited over the TiN layer 4 in a thickness of 5,000 Å by an ordinary CVD process. ((C) of FIG. 1) Since the Blk-W has a coverage higher than 90% even at the contact hole portion, it suffices to deposit it at least in a thickness of 2,000 Å to fill the contact hole of 0.4 μm diameter with tungsten.

In place of an ordinary CVD process, it is preferable to deposit Blk-W by a biased ECR-CVD process to suppress the occurrence of the crack seam 6 and to improve the surface morphology of the metal layer of Blk-W or the like. For example, in order to deposit Blk-W by a biased ECR-CVD process, there may be employed the conditions of $WF_6/SiH_4/H_2/Ar=20/30/100/50$ SCCM, microwave output of 1 KW, RF output of 500 W, pressure of $7 \times 10^{-4}$ Torr and flux density of 875 Gauss.

In the next place, the surface of Blk-W is polished by the use of a polisher. In this regard, the polisher to be used in the present invention may be an ordinary one which is generally used for polishing silicon wafers. A polisher of this sort is schematically shown in FIG. 3. In this figure, the polisher is provided with a polisher plate 34 covered with a pad 35 and a wafer holder 37, which are rotated at certain speeds by a polisher plate spindle 36 and a wafer holder spindle 38 in the arrowed directions relative to each other.

For polishing the surface of the Blk-W layer, the substrate 1 is set on the wafer holder 36 in such a way that the Blk-W surface faces toward the polisher plate 34. Nextly, while supplying a slurry of an ordinary silica-base abrasive particles onto the polisher plate 34 through a slurry feed pipe 32 and pressing the substrate 1 against the polisher plate 34, for example, with a pressure of 5.0 p.s.i., the polisher plate 34 and wafer holder 37 are put in rotation (e.g., setting the speed of the polisher plate at 12 r.p.m. and the speed of the wafer holder at 26 r.p.m.). The surface of Blk-W can be flattened ((D) of FIG. 1) by polishing same to a degree corresponding to abrasion of 3,000 Å. ((D) of FIG. 1)

Further, by etching back the entire surface of the flattened Blk-W layer by an ordinary process, there can be obtained a flat layer insulation film 2 and a flat metal plug 7 free of transfer of the surface morphology of the Blk-W layer in unpolished state or before the polishing operation. ((E) of FIG. 1) In this connection, it is also possible to form a metal plug as shown at (E) of FIG. 1 by increasing the degree of polishing to about 5,000 Å instead of carrying out etching-back step.

The thus flattened Blk-W ((D) of FIG. 1) is in a suitable condition to form a tungsten wiring layer thereon by a lithographic process.

Figure 2A:
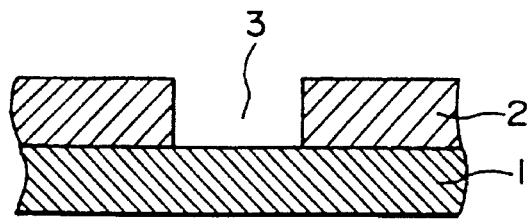
FIGS. 2A–2F are diagrammatic illustrations explanatory of a method of forming a metal plug in another embodiment of the invention.
Figure 2B:
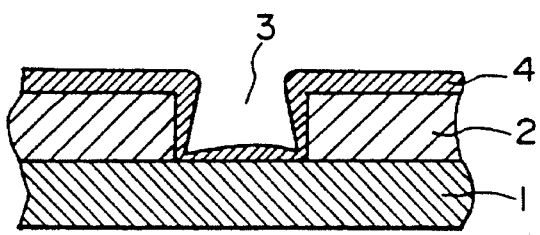
Figure 2C:
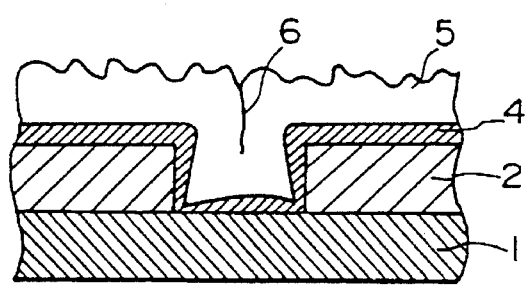
Figure 2D:
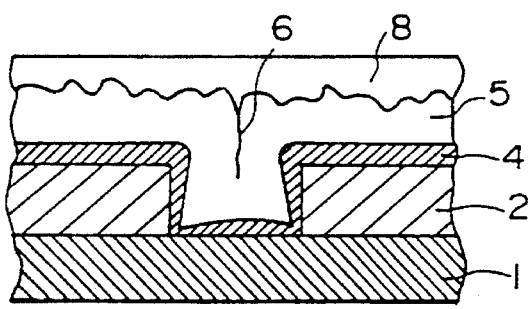
Figure 2E:
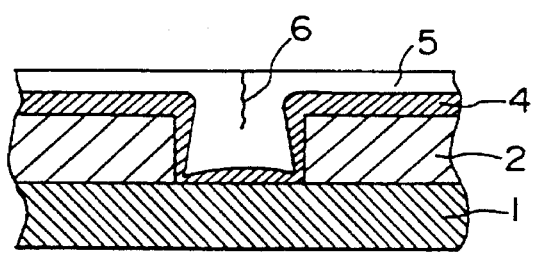
Figure 2F:
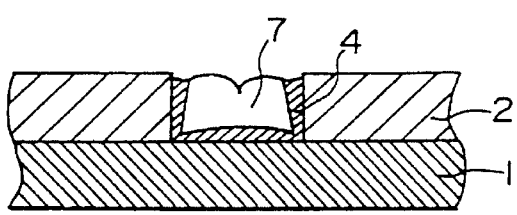
Figure 4A:
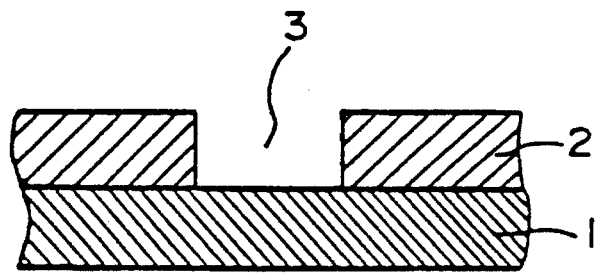
FIGS. 4A–4D are diagrammatic illustrations explanatory of the steps of forming a metal plug by a conventional method.
Figure 4B:
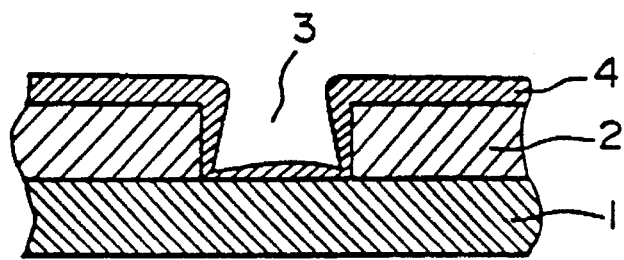
Figure 4C:
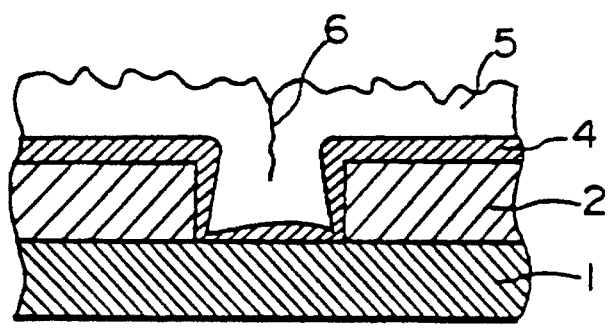
Figure 4D:
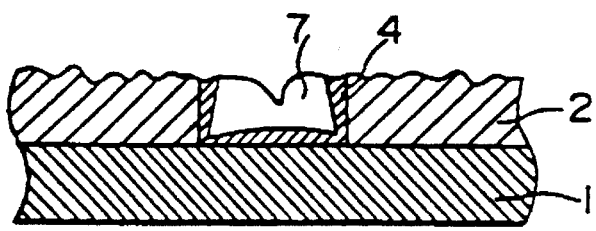

Referring to FIG. 2, there is diagrammatically shown another embodiment of the metal plug forming method of the present invention. In this embodiment, SOG or the like is coated in a thickness of 3,000 Å on deposited Blk-W, for example, by means of a spin coater to form a coating film layer 8 as at (D) of FIG. 2 prior to polishing. The coating film layer 8, formed by a spin coater, is extremely flat, so that the surface of the Blk-W layer can be flattened all the more by polishing same together with the coating film 8. The steps (A), (B), (C), (E) and (F) of FIG. 2 correspond to and same as the steps (A), (B), (C), (D) and (E) of FIG. 1, and therefore description in this regard is omitted here to avoid repetitions.

As described hereinbefore, the present invention provide a method for forming a metal plug, which essentially includes a step of polishing the surface of a metal layer, deposited in such a way as to fill in a contact hole in an insulation film layer on a substrate and to cover the insulation film layer, thereby flattening the surfaces of the metal plug and the insulation film layer to enhance the reliability of a wiring layer to be formed thereon.

Similarly, in the method of forming a wiring layer according to the invention, the flattened surface of the metal layer permits lithographic printing as well as accurate patterning of the wiring metal.

What is claimed is:

1. A method of forming a metal plug in a contact hole provided in an insulation layer on a substrate, comprising the steps of:

forming a non-flat metal layer in the contact hole to fill the contact hole and extend above the contact hole and laterally above a surface of the insulation layer, polishing a surface of the metal layer to planarize the metal layer surface;

etching back the planarized metal layer to expose a surface of the insulation layer; and forming a coating film on the metal layer prior to the polishing step, wherein the polishing step is performed by polishing the coating film and the metal layer surface.

2. A method of forming a wiring layer by filling a metal in a contact hole provided in an insulation layer on a substrate, comprising the steps of, forming a non-fiat metal layer in the contact hole to fill the contact hole and extend above the contact hole and laterally above a surface of the insulation layer, polishing a surface of the metal layer to planarize the metal layer surface;

etching back the planarized metal layer to expose a surface of the insulation layer; and forming a coating film on the metal layer prior to the polishing step, wherein the polishing step is performed by polishing the coating film and the metal layer surface.

* * * * *